United States Patent [19]

Sekiya

[11] Patent Number: 5,424,165

[45] Date of Patent: Jun. 13, 1995

[54] DIAZO RESIN LIGHT-SENSITIVE COMPOSITION CONTAINING ORGANIC COMPOUND HAVING AT LEAST 3 CARBOXYL GROUPS

[75] Inventor: Toshiyuki Sekiya, Shizuoka, Japan

[73] Assignee: Fuji Photo Film Co., Ltd., Minami-Ashigara, Japan

[21] Appl. No.: 990,188

[22] Filed: Dec. 14, 1992

[30] Foreign Application Priority Data

Dec. 17, 1991 [JP] Japan .................................. 3-332350

[51] Int. Cl.$^6$ .............................................. G03F 7/021
[52] U.S. Cl. .................................... 430/157; 430/175; 430/176; 430/278
[58] Field of Search ................ 430/175, 176, 157, 278

[56] References Cited

U.S. PATENT DOCUMENTS

| | | |
|---|---|---|
| 3,375,113 | 3/1968 | Doggett . |
| 4,172,729 | 10/1979 | Naritomi et al. . |
| 4,232,105 | 11/1980 | Shinohara et al. ................. 430/160 |
| 4,576,893 | 3/1986 | Nakakita et al. ..................... 430/176 |
| 4,731,316 | 3/1988 | Tomiyasu et al. ................... 430/157 |
| 4,983,491 | 1/1991 | Aoai et al. ............................. 430/175 |
| 5,240,808 | 8/1993 | Aoshima et al. ..................... 430/176 |

FOREIGN PATENT DOCUMENTS

| | | |
|---|---|---|
| 0130488 | 1/1985 | European Pat. Off. . |
| 0256309 | 2/1988 | European Pat. Off. . |
| 2106555 | 5/1972 | France . |
| 3306963 | 9/1983 | Germany . |
| 4116519 | 11/1991 | Germany . |
| 2-90163 | 3/1990 | Japan . |

*Primary Examiner*—Charles L. Bowers, Jr.
*Assistant Examiner*—Christopher G. Young
*Attorney, Agent, or Firm*—Burns, Doane, Swecker & Mathis

[57] ABSTRACT

A light-sensitive composition comprises a diazo resin, a polymeric binder and a low molecular weight organic compound having at least 3 carboxyl groups and free of other functional groups containing elements other than hydrogen and carbon atoms. The composition may further comprise a compound carrying at least one phosphorus atom-containing oxoacid residue and a compound carrying at least one sulfonic acid residue. The light-sensitive composition can easily be developed with an aqueous alkaline developer, can provide a lithographic printing plate having good printing durability and has excellent storage stability. Therefore, the developability and resistance to background contamination thereof are not deteriorated even after storing under high temperature and humidity conditions over a long time period.

18 Claims, No Drawings

DIAZO RESIN LIGHT-SENSITIVE COMPOSITION CONTAINING ORGANIC COMPOUND HAVING AT LEAST 3 CARBOXYL GROUPS

BACKGROUND OF THE INVENTION

The present invention relates to a light-sensitive composition used for, in particular, preparing a presensitized plate for use in making a lithographic printing plate and more specifically to a light-sensitive composition which is excellent in developability with an aqueous alkaline developer, ensures the formation of a lithographic printing plate having good printing durability and is improved in storage stability.

The majority of the compounds used as light-sensitive substances for printing materials to which light-sensitivity is preliminarily imparted are diazonium compounds and most commonly used are diazo resins represented by a condensate of p-diazodiphenylamine with formaldehyde. When such a diazo resin is applied onto the surface of an appropriate substrate such as paper, a plastic film or a metal plate and then exposed to actinic light rays through a negative transparency, the diazo resin present in the exposed area of the light-sensitive material is decomposed into an insoluble substance. Therefore, the unexposed area thereof can be removed by dissolving in an appropriate developer to thus reveal the surface of the substrate. For this reason, if a substrate whose surface has previously been hydrophilized is used, the hydrophilized surface thereof behind the unexposed area is revealed through development. The revealed surface thus receives water but repels an ink during printing operation using, for instance, an offset printing press. On the other hand, the exposed area (or the decomposed diazo resin) of the light-sensitive material has lipophilicity and repels water, but receives an ink. In other words, the printing material of this kind provides a so-called negative-positive type printing plate.

The light-sensitive composition of this type has low storage stability and accordingly requires the use of a stabilizer. There have been proposed various such stabilizers, for instance, phosphorous acid as disclosed in Japanese Unexamined Patent Publication (hereinafter referred to as "J. P. KOKAI") No. Sho 52-151023, halogen atom-containing organic phosphoric acid ester compounds as disclosed in J. P. KOKAI No. Sho 50-36207, oxalic acid as disclosed in U.K. Patent No. 548,344, high molecular weight organic acids as disclosed in J. P. KOKAI No. Sho 56-107238 and malic acid as disclosed in J. P. KOKAI No. Sho 60-262154. These stabilizers are only slightly effective and still insufficient.

The compositions comprising diazo resins used for forming the light-sensitive layer of presensitized plates for use in making lithographic printing plates (hereinafter referred to as "PS plates") can be divided into those comprising only diazo resins and free of binders as disclosed in U.S. Pat. No. 2,714,066 and those comprising binders and diazo resins in combination as disclosed in, for instance, U.S. Pat. No. 4,123,276. However, most of the recent PS plates comprising diazonium compounds simultaneously contain polymers serving as binders for the purpose of imparting high printing durability to the resulting printing plates.

As such light-sensitive layers, there have been known so-called alkali-developable ones whose unexposed area is removed (developed) with an aqueous alkaline developer such as those disclosed in Japanese Patent Publication for Opposition Purpose (hereinafter referred to as "J. P. KOKOKU") No. Sho 52-7362 (=U.S. Pat. No. 4,275,138) and so-called solvent-developable ones whose exposed area is removed with a developer comprising an organic solvent. Among these, the former has attracted special interest from the viewpoint of industrial safety and health.

However, the alkali-developable light-sensitive layers in general have insufficient printing durability and accordingly, there has been desired for the development of light-sensitive layers which simultaneously satisfy the requirements of high alkali-developability and printing durability.

SUMMARY OF THE INVENTION

Accordingly, an object of the present invention is to provide a light-sensitive composition which can simultaneously satisfy the requirements of high alkali-developability and printing durability and has high storage stability, or whose developability and resistance to background contamination are not impaired even after storing under high temperature and humidity conditions over a long time.

The inventors of this invention have conducted various studies, have found that the foregoing object can effectively be achieved by the use of a low molecular weight organic compound having at least 3 carboxyl groups and free of other functional group containing elements other than hydrogen and carbon atoms in addition to a diazo resin and a polymer binder and thus have completed the present invention.

According to the present invention, there is provided a light-sensitive composition comprising a diazo resin, a polymeric binder and a low molecular weight organic compound having at least 3 carboxyl groups and free of other functional groups containing elements other than hydrogen and carbon atoms.

DESCRIPTION OF THE PREFERRED EMBODIMENTS

The light-sensitive composition of the present invention will hereinafter be explained in more detail.

The low molecular weight organic compound having at least 3 carboxyl groups and free of other functional groups containing elements other than hydrogen and carbon atoms used in the invention (hereinafter referred to as "organic compound of the invention") is an organic compound which comprises a skeleton comprising only hydrogen and carbon atoms such as an alkyl or aryl group which is substituted with at least 3 carboxyl groups and which has a molecular weight of not more than 1,000, preferably not more than 500.

Specific examples of the organic compounds of the invention are propane-1,2,3-tricarboxylic acid, butane-1,2,3-tricarboxylic acid, butane-1,2,4-tricarboxylic acid, butane-1,2,3,4-tetracarboxylic acid, 2-carboxymethylpropane-1,3-dicarboxylic acid, pentane-1,2,3-tricarboxylic acid, pentane-1,2,4-tricarboxylic acid, pentane-1,2,5-tricarboxylic acid, pentane-1,3,4-tricarboxylic acid, pentane-2,3,4-tricarboxylic acid, pentane-1,2,3,4-tetracarboxylic acid, pentane-1,2,3,5-tetracarboxylic acid, 2-carboxymethylbutane-1,3-dicarboxylic acid, 2-carboxymethylbutane-1,4-dicarboxylic acid, 3-carboxymethylbutane-1,2-dicarboxylic acid, 3-carboxy methylbutane-1,2,4-tricarboxylic acid, 2,2-dicarboxy methylpropane-1,3-dicarboxylic acid, 1,2,3,4-cyclopentane tetracarboxylic acid, hemimellitic acid, trimellitic acid, trimesic acid, pyromellitic acid and naphthalene-1,4,5,8-tetracarboxylic acid, with those comprising alkyl groups having not more than 5 carbon atoms to which at least 3 carboxyl groups are bonded being preferred and propane-1,2,3-tricarboxylic acid being most preferred.

The amount of the organic compound of the invention to be incorporated into the light-sensitive composition ranges from 0.01 to 20% by weight and preferably 0.1 to 5% by weight on the basis of the total weight of the solid content of the composition. If the content of the organic compound of the invention is less than 0.01% by weight, the storage stability of the resulting composition is lowered, while if it exceeds 20% by weight, the printing durability of the finally formed lithographic printing plate is impaired.

The light-sensitive composition of the present invention preferably comprises a compound carrying at least one phosphorus atom-containing oxoacid residue and a compound carrying at least one sulfonic acid residue in addition to the foregoing organic compound of the invention.

The "compound carrying at least one phosphorus atom-containing oxoacid residue (hereinafter referred to as "phosphorus atom-containing oxoacid compound")" used in the invention is a compound having at least one P—OH group which comprises phosphorous acid, hypophosphorous acid, phosphoric acid, phosphonic acid or phosphinic acid, as principal skeleton, whose hydrogen atom directly bonded to the phosphorus atom of the skeleton is substituted with a substituted or unsubstituted hydrocarbon or heterocyclic group, or an ester thereof.

Specific examples thereof include phosphorous acid, methyl phosphite, ethyl phosphite, propyl phosphite, butyl phosphite, phenyl phosphite, benzyl phosphite, dimethyl phosphite, diethyl phosphite, dipropyl phosphite, dibutyl phosphite, diphenyl phosphite and dibenzyl phosphite;

hypophosphorous acid, methylhypophosphorous acid, ethylhypophosphorous acid, propylhypophosphorous acid, butylhypophosphorous acid, phenylhypophosphorous acid, benzylhypophosphorous acid, methyl hypophosphite, ethyl hypophosphite, propyl hypophosphite, butyl hypophosphite, phenyl hypophosphite, benzyl hypophosphite and ethyl methylhypophosphite;

phosphoric acid, methyl phosphate, ethyl phosphate, propyl phosphate, butyl phosphate, phenyl phosphate, benzyl phosphate, dimethyl phosphate, diethyl phosphate, dipropyl phosphate, metaphosphoric acid, pyrophosphoric acid, triphosphoric acid, tetraphosphoric acid, dibutyl phosphate, diphenyl phosphate and dibenzyl phosphate;

phosphonic acid, methylphosphonic acid, ethylphosphonic acid, propylphosphonic acid, butylphosphonic acid, phenylphosphonic acid, p-chlorophenylphosphonic acid, p-bromophenylphosphonic acid, o-tolylphosphonic acid, m-tolylphosphonic acid, p-tolylphosphonic acid, methyl phenylphosphonate, ethyl phenylphosphonate, propyl phenylphosphonate, butyl phenylphosphonate and acetylphosphonic acid; and phosphinic acid, methylphosphinic acid, ethylphosphinic acid, propylphosphinic acid, butylphosphinic acid, phenylphosphinic acid, benzylphosphinic acid, dimethylphosphinic acid, diethylphosphinic acid, dipropylphosphinic acid, dibutylphosphinic acid, diphenylphosphinic acid, ethylmethylphosphinic acid and 2-furylphosphinic acid;

as well as alkali metal, alkaline earth metal and ammonium salts thereof; with phosphorous acid and phosphoric acid being most preferred.

The compound having at least one sulfonic acid residue used in the invention (hereinafter referred to as "sulfonic acid compound") is a compound comprising a hydrocarbon or heterocyclic group to which at least one sulfonic acid residue is attached and which is free of a phosphorus atom-containing oxoacid residue.

Specific examples thereof include methanesulfonic acid, ethanesulfonic acid, propanesulfonic acid, butanesulfonic acid, benzenesulfonic acid, benzylsulfonic acid, o-tolylsulfonic acid, m-tolylsulfonic acid, p-tolylsulfonic acid, o-hydroxybenzenesulfonic acid, m-hydroxybenzenesulfonic acid, p-hydroxybenzenesulfonic acid, 2,3-dimethylbenzenesulfonic acid, 2,4-dimethylbenzenesulfonic acid, 2,5-dimethylbenzenesulfonic acid, 2,6-dimethylbenzenesulfonic acid, 2,4,6-trimethylbenzenesulfonic acid, 2,4-dihydroxybenzenesulfonic acid, 2,5-dihydroxybenzenesulfonic acid, 2,6-dihydroxybenzenesulfonic acid, p-chlorobenzenesulfonic acid, m-nitrobenzenesulfonic acid, o-formylbenzenesulfonic acid, 2-hydroxy-5-formylbenzenesulfonic acid, 2-sulfobenzoic acid, 3-sulfobenzoic acid, 4-sulfobenzoic acid, 3-sulfophthalic acid, 4-sulfophthalic acid, 2-sulfoterephthalic acid, 5-sulfoisophthalic acid, 5-sulfosalicylic acid, 1,3-benzenesulfonic acid, pyridine-2-sulfonic acid, 2-hydroxypyridine-5-sulfonic acid, 4-sulfodiphenylamine, 1-naphthalenesulfonic acid, 2-naphthalenesulfonic acid, 1,6-naphthalenedisulfonic acid, anthraquinone-1-sulfonic acid, anthraquinone-2-sulfonic acid, 2-hydroxy-4-methoxy-5-benzoylbenzenesulfonic acid, dodecylbenzenesulfonic acid, propylnaphthalenesulfonic acid, dipropylnaphthalenesulfonic acid, butylnaphthalenesulfonic acid, dibutylnaphthalenesulfonic acid, and alkali metal, alkaline earth metal and ammonium salts thereof.

Most preferably used are compounds each having an aromatic ring to which at least 2 carboxyl groups and one sulfonic acid residue are bonded such as 3-sulfophthalic acid, 4-sulfophthalic acid, 2-sulfoterephthalic acid and 5-sulfoisophthalic acid; compounds whose aromatic ring has hydroxyl, carboxyl and sulfonic acid residue such as 5-sulfosalicylic acid; 2-hydroxy-4-methoxy-5-benzoylbenzenesulfonic acid and dibutylnaphthalenesulfonic acid.

The amounts of the foregoing phosphorus atom-containing oxoacid compound and sulfonic acid compound range from 0.01 to 10% by weight and preferably 0.1 to 5% by weight on the basis of the total weight of the solid content of the light-sensitive composition, respectively. This is because if they are less than 0.01% by weight, the storage stability of the resulting light-sensitive composition is lowered while if they exceed 10% by weight, the printing durability of the finally obtained lithographic printing plate is impaired. Moreover, the amount of the sum of the phosphorus atom-containing oxoacid compound and the sulfonic acid compound is preferably not more than 15% by weight. This is because if it exceeds 15% by weight, the printing durability is impaired.

The diazo resins used in the invention include, for instance, inorganic salts of diazo resins which are organic solvent-soluble reaction products of condensates of p-diazodiphenylamine and formaldehyde or acetaldehyde with hexafluorophosphoric acid salts or tetrafluoroboric acid salts; reaction products of the foregoing condensates with sulfonic acids such as p-toluenesulfonic acid or salts thereof, phosphonic acids such as benzenephosphinic acid or salts thereof, and hydroxyl group-containing compounds such as 2,4-dihydroxybenzophenone and 2-hydroxy-4-methoxybenzophenone-5-sulfonic acid or salts thereof as disclosed in U.S. Pat. No. 3,300,309; organic solvent-soluble diazo resins which are reaction products of the foregoing condensates with long chain alkyl group-containing sulfonic acids as disclosed in J. P. KOKAI Nos. Sho 58-209733, Sho 62-175731 and Sho 63-26264; and co-condensed diazo resins of the foregoing condensates with aromatic compounds as disclosed in J. P. KOKOKU No. Sho 49-48001 (=U.S. Pat. No. 3,867,147); and diazo resins obtained through chain opening polymerization of the foregoing condensates with epoxy resins (J. P. KOKAI No. Hei 4-338756) or through reactions of the condensates with olefinically unsaturated compounds (J. P. KOKAI No. Sho 58-187925).

Examples of other diazo resins preferably used in the invention include co-condensed diazo resins comprising, as structural units, those derived from aromatic diazonium compounds and aromatic compounds carrying at least one group selected from the group consisting of carboxyl group, sulfonic acid residues, sulfinic acid residues and phosphorus atom-containing oxoacid residues (hereinafter referred to as "acid groups"). Examples of preferred aromatic compounds carrying acid groups are disclosed in J. P. KOKAI Nos. Hei 2-29650, Hei 2-253857 and Hei 4-211253, with 4-methoxybenzoic acid, p-hydroxybenzoic acid, phenoxyacetic acid and phenylphosphoric acid being particularly preferred. On the other hand, examples of the aromatic diazo compounds are those disclosed in U.S. Pat. No. 3,867,147, with diazo compounds derived from 3-methoxy-4-amino-4-diphenylamine and 4-amino-diphenylamine being particularly preferred.

The foregoing co-condensed diazo resins can be prepared by any known method such as those disclosed in Photo. Sci. Eng., 1973, 17, p. 33, U.S. Pat. Nos. 2,063,631 and 2,679,498 and U.S. Pat. No. 3,867,147.

The molar ratio of the charged aromatic compound carrying at least one acid group to the charged aromatic diazo compound in general ranges from 1:0.1 to 0.1:1, preferably 1:0.5 to 0.2:1 and more preferably 1:1 to 0.2:1.

Methods for introducing the acid groups into the diazo resins other than the foregoing co-condensation of the aromatic compounds carrying the acid groups with the aromatic diazonium compounds are those disclosed in J. P. KOKAI. No. Hei 4-18559 (=U.S. Pat. No. 5,112,743) and J. P. KOKAI Nos. Hei 3-163551 and Hei 3-253857 which comprise condensing the aromatic diazonium compounds with aldehyde or acetal compounds containing acid groups and the diazo resins thus obtained can likewise be preferably used in the present invention.

The counter ions (anions) for the foregoing diazo resins are preferably anions which form stable salts with the diazo resins and can convert the diazo resins into organic solvent-soluble ones. Examples thereof are disclosed in, for instance, J. P. KOKAI Nos. Hei 2-219060, Hei 4-18559 and Hei 4-172354, with butylnaphthalenesulfonic acid, dibutylnaphthalenesulfonic acid, hexafluorophosphoric acid, 2-hydroxy-4-methoxybenzophenone-5-sulfonic acid and dodecylbenzenesulfonic acid being particularly preferred.

The molecular weight of the diazo resin can be arbitrarily controlled by variously changing the reaction conditions during the synthesis thereof, but the molecular weight thereof preferably used in the invention ranges from about 400 to 100,000 and preferably about 800 to 20,000.

The foregoing diazo resins can be used alone or in combination.

The polymeric binders used in the present invention must be those capable of being dissolved in or swollen with an alkaline aqueous developer and capable of being photolytically crosslinked through the action of the foregoing light-sensitive diazo resins.

Examples of particularly preferred organic polymeric binders are copolymers comprising, as essential repeating units, those derived from (meth)acrylic acid, crotonic acid and/or maleic acid such as multi-component copolymers of 2-hydroxyethyl (meth)acrylate, (meth)acrylonitrile and optional other copolymerizable monomers as disclosed in U.S. Pat. No. 4,123,276; multi-component copolymers of (meth)acrylic acid having a terminal hydroxyl group and esterified with a group containing a dicarboxylic acid ester residue, (meth)acrylic acid and optional other copolymerizable monomers as disclosed in J. P. KOKAI No. Sho 53-120903; multi-component copolymers of monomers having terminal aromatic hydroxyl groups (for instance, N-(4-hydroxyphenyl)methacrylamide), (meth)acrylic acid and optional other copolymerizable monomers as disclosed in J. P. KOKOKU No. Sho 57-43890; multi-component copolymers of alkyl acrylates, (meth)acrylonitrile and unsaturated carboxylic acids as disclosed in J. P. KOKAI No. Sho 56-4144 (=U.S. Pat. No. 4,304,832); and modified polyvinyl acetal resins as disclosed in U.S. Pat. Nos. 4,631,245 and 4,741,985.

Examples of other preferred organic polymeric binders are polyurethane resins having substituents carrying acidic hydrogen atoms as disclosed in U.S. Pat. Nos. 4,877,711, 4,950,582 and 4,983,491, and J. P. KOKAI Nos. Sho 63-287946, Sho 63-287927, Hei 1-134354, Hei 2-146042 and Hei 2-77748. These polyurethane resins are most favorable for the improvement of the storage stability by the action of the compounds of the invention and are most preferred polymeric binders for use in combination with the compounds of the invention. The term "substituents carrying acidic hydrogen atoms" herein means groups having acid dissociation constants (pKa values) in water of not higher than 7 such as —COOH, —SO$_2$NHCOO—, —CONHSO$_2$—, —CONHSO$_2$NH— and —NHCONHSO$_2$—, with —COOH being particularly preferred.

In addition, useful alkali-soluble polymeric compounds likewise include, for instance, other acidic polyvinyl alcohol derivatives and acidic cellulose derivatives as well as polymeric compounds obtained by converting polyvinyl acetals into alkali-soluble ones as disclosed in U.K. Patent No. 1,370,316.

The amounts of these light-sensitive diazo resin and polymer binder in the light-sensitive composition of the invention range from 3 to 40% by weight for the diazo resin and 97 to 60% by weight for the polymer binder on the basis of the total amount of these components. The lower the content of the diazo resin, the higher the sensitivity of the resulting composition, but if the content thereof is less than 3% by weight, the binder cannot photolytically be hardened sufficiently and accordingly, the strength of the photolytically hardened film is liable to be lowered since the hardened film gets swollen with a developer during the development. On the other hand, if the content of the diazo resin exceeds 40% by weight, the sensitivity of the resulting composition is reduced and is not practically acceptable. These components are more preferably used in amounts ranging from 5 to 30% by weight for the diazo resin and 95 to 70% by weight for the polymer binder.

The light-sensitive composition of the invention may further comprise a dye. The dye is used for obtaining a visible image (an image becoming visible through exposure to light) immediately after the imagewise exposure to light and for obtaining a visible image after development.

The dyes preferably used are those which can undergo a color tone change through a reaction with a free radical or an acid. The term "color tone change" herein includes a change from colorlessness to a color; a change from a color to colorlessness or another color. Preferred are those undergoing color tone changes through formation of salts with acids.

Examples of these dyes are triphenylmethane type, diphenylmethane type, oxazine type, xanthene type, iminonaphthoquinone type, azomethine type or anthraquinone type dyes such as Victoria Pure Blue BOH (available from Hodogaya Chemical Co., Ltd.) and naphthalenesulfonate thereof, Oil Blue #603 (available from Orient Chemical Co., Ltd.), Patent Pure Blue (Sumitomo Mikuni Chemical Co., Ltd.), Crystal Violet, Brilliant Green, Ethyl Violet, Methyl Violet, Methyl Green, Erythrosine B, Basic Fuchsine, Malachite Green, Oil Red, m-Cresol Purple, Rhodamine B, Auramine, 4-p-diethylaminophenyl iminaphthoquinone and cyano-p-diethylaminophenyl acetanilide for the dye undergoing a color tone change from a color to colorlessness or another color.

On the other hand, examples of the dye undergoing a color tone change from colorlessness to a color are leuco dyes and primary and secondary arylamine type dyes such as triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p',p''-tris-dimethylaminotriphenylmethane, p,p'-bis-dimethylaminodiphenylmethylimine, p,p',p''-triamino-o-methyltriphenylmethane, p,p'-bis-dimethylaminodiphenyl-4-anilinonaphthylmethane and p,p',p''-triaminotriphenylmethane.

Particularly preferred are triphenylmethane type and diphenylmethane type dyes with triphenylmethane type dyes being more preferred and Victoria Pure Blue BOH and naphthalenesulfonate thereof being most preferred. These dyes may be used alone or in combination.

The light-sensitive composition comprises these dyes in an amount preferably ranging from about 0.5 to about 10% by weight and more preferably about 1 to 5% by weight on the basis of the total solid content of the composition.

The light-sensitive composition of the invention may further comprise other various additives.

Preferably used in the composition are, for instance, alkyl ethers (such as ethyl cellulose and methyl cellulose), fluorine atom-containing surfactants, nonionic surfactants (in particular, fluorine atom-containing surfactants as disclosed in J. P. KOKAI Nos. Sho 62-170950 and Sho 62-226143 and U.S. Pat. No. 3,787,351 such as Megafac F-171, 173 and 177, Defenser MCF 300, 312 and 313 (these are all available from Dainippon Ink and Chemicals, Inc.) and Modipar F- 100, 102 and 110 (these are all available from Nippon Oil and Fats Co., Ltd.)) for improvement of coating properties of the composition; plasticizers (such as butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of (meth)acrylic acid, in particular, tricresyl phosphate) for imparting flexibility and wear resistance to the resulting coated film; stabilizers other than the organic compounds of the invention (such as phosphoric acid, phosphorous acid, pyrophosphoric acid, phenylphosphonic acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, 3-sulfophthalic acid, 4-sulfophthalic acid, 4-sulfoterephthalic acid, 2-sulfoterephthalic acid, 5-sulfoisophthalic acid, isopropylnaphthalenesulfonic acid, t-butylnaphthalenesulfonic acid, malic acid, tartaric acid, dipicolinic acid, homopolymers and copolymers of acrylic acid, homopolymers and copolymers of vinylphosphonic acid, homopolymers and copolymers of vinylsulfonic acid, 5-nitronaphthalene-1-phosphonic acid, 4-chlorophenoxymethylphosphonic acid, sodium phenyl-methylpyrazolonesulfonate, citric acid, 2-phosphonobutane-1,2,4-tricarboxylic acid, 1-phosphonoethane-1,2,2-tricarboxylic acid and 1-hydroxyethane-1,1-disulfonic acid); developing accelerators (such as higher alcohols, acid anhydrides and anionic surfactants); and/or sensitizing agents for enhancing the ink receptivity of image portions (for instance, half-esterified products of styrene-maleic anhydride copolymer with alcohols as disclosed in U.S. Pat. No. 4,294,905, novolak resins such as p-t-butylphenol/formaldehyde resin, fluorine atom-containing surfactants and fatty acid esters of p-hydroxystyrene). The amount of these additives to be added varies depending on the applications of the composition and purposes, but in general ranges from 0.01 to 30% by weight on the basis of the total solid content of the composition.

The light-sensitive composition comprising the foregoing components is applied onto the surface of an appropriate substrate to give a PS plate.

Examples of substrates usable in the present invention are paper, paper laminated with a plastic film (such as a polyethylene, polypropylene or polystyrene film), metal plates such as aluminum (including alloys thereof), zinc and copper plates, plastic films such as cellulose diacetate, cellulose triacetate, cellulose propionate, polyethylene terephthalate, polyethylene, polypropylene, polycarbonate and polyvinyl acetal films, paper and plastic films which are laminated with foils of the foregoing metals or on which the foregoing metals are vapor-deposited and steel plates plated with aluminum or chromium, with aluminum substrates and composite substrates coated with aluminum being particularly preferred.

Preferred aluminum plates are 1S aluminum plates. Moreover, the aluminum materials are desirably surface-treated in order to improve the water retention and adhesion to the light-sensitive layer subsequently applied thereto.

Examples of surface-toughening treatments include commonly known brush graining, ball graining, electrolytic etching, chemical etching, liquid honing, sandblasting methods and combination thereof, with brush graining, electrolytic etching, chemical etching and liquid honing methods being preferred and surface-toughening treatments comprising electrolytic etching being particularly preferred.

In addition, it is also preferred to perform electrolytic etching after brush graining as disclosed in U.S. Pat. No. 4,476,006. Electrolytic baths used in the electrolytic etching are aqueous solutions of acids, alkalis or salts thereof or these aqueous solutions to which organic solvents are added. Amont these, preferred are electrolytes containing hydrochloric acid, nitric acid or salts thereof.

The surface-roughened aluminum plate is optionally subjected to desmutting by immersing it in an aqueous solution of an acid or alkali. The aluminum plate thus treated is preferably subjected to anodization which is preferably carried out in a bath containing a sulfuric acid or phosphoric acid solution.

The aluminum plate may, if necessary, be subjected to a silicate treatment (sodium silicate or potassium silicate) as described in U.S. Pat. Nos. 2,714,066 and 3,181,461; a treatment with potassium fluorozirconate as described in U.S. Pat. No. 2,946,638; a phosphomolybdate treatment as disclosed in U.S. Pat. No. 3,201,227; an alkyl titanate treatment as disclosed in U.K. Patent No. 1,108,559; a polyacrylic acid treatment as disclosed in German Patent No. 1,091,433; a treatment with a polyvinylphosphonic acid as disclosed in German Patent No. 1,134,093 and U.K. Patent No. 1,230,447; a treatment with a phosphonic acid as disclosed in U.S. Pat. No. 4,153,461; a phytic acid treatment as disclosed in U.S. Pat. No. 3,307,951; a treatment with a divalent metal salt of hydrophilic organic polymer as disclosed in J. P. KOKAI Nos. Sho 58-16893 and Sho 58-18291; a hydrophilization treatment through the application of an underlying coating of a water-soluble polymer carrying sulfonate residues as disclosed in U.S. Pat. No. 4,578,342; and/or a coloring treatment with an acidic dye as disclosed in J. P. KOKAI No. Sho 60-64352. Other useful hydrophilization treatments include, for instance, silicate electrodeposition as disclosed in U.S. Pat. No. 3,658,662.

It is also preferred to carry out a sealing treatment after the graining and anodization. The sealing treatment can be performed by immersing the plate in hot water, a hot aqueous solution of an inorganic or organic salt or by the use of a steam bath.

More specifically, the substrate suitably used in the invention can be obtained by, for instance, immersing an IS aluminum plate which comprises 0.1 to 0.5% Fe, 0.03 to 0.3% Si, 0.003 to 0.03% Cu and 0.01 to 0.1% Ti in an alkaline aqueous solution, preferably a 1 to 30% aqueous sodium hydroxide, potassium hydroxide, sodium carbonate or sodium silicate solution at a temperature ranging from 20° to 80° C. for 5 to 250 seconds to etch the plate (the bath for etching may comprise aluminum in an amount of 1/5 time that of the alkali), then immersing it in a 10 to 30% nitric acid or sulfuric acid aqueous solution at 20° to 70° C. for 5 to 250 seconds for neutralization and desmutting of the plate.

After cleaning the surface of the aluminum alloy plate, the plate is surface-toughened as follows. The surface-roughening treatment is preferably brush graining or/and electrolytic etching. The temperature of the electrolyte is in general 10° to 60° C. The alternating current used in the electrolytic etching may be those having any wave form such as rectangular, trapezoidal and sine waves so far as the polarity thereof is alternatively changed, such as single-phase and three-phase alternating currents as the usual commercially available alternating currents. The treatment is preferably performed at a current density of 5 to 100 A/dm$^2$ for 10 to 300 seconds.

The surface roughness of the aluminum alloy substrate used in the invention is controlled so as to fall within the range of from 0.2 to 0.8 μm by adjusting the quantity of electricity during the surface-roughening treatment.

The aluminum alloy plate thus surface-roughened is preferably treated with a 10 to 50% hot sulfuric acid solution (40° to 60° C.) or a dilute alkali solution (such as sodium hydroxide) to remove smut adhered to the surface of the plate. If the desmutting is carried out using an alkali, the plate is subsequently washed and neutralized by immersing in an aqueous solution of an acid (such as nitric acid or sulfuric acid).

After desmutting the surface, an anodized layer is formed. The anodization can be performed by the conventionally well-known methods, but a sulfuric acid solution is used as the most effective electrolyte. Phosphoric acid is also a useful electrolyte second to sulfuric acid. Useful electrolytes further include, for instance, mixtures of sulfuric acid and phosphoric acid as disclosed in U.S. Pat. No. 2,229,226.

The sulfuric acid method generally uses a direct current, but an alternating current may likewise be used. The sulfuric acid concentration ranges from 5 to 30%, the anodization temperature ranges from 20 to 60° C., the anodization time ranges from 5 to 250 seconds. The thickness of the anodized layer ranges from 1 to 10 g/m$^2$. The electrolyte preferably comprises aluminum ions. The anodization is carried out at a current density of 1 to 20 A/dm$^2$.

On the other hand, the phosphoric acid method is carried out at an electrolyte concentration of 5 to 50%, a temperature ranging from 30° to 60° C., an anodization time of 10 to 300 seconds and a current density of 1 to 15 A/dm$^2$.

The aluminum substrate thus treated is desirably surface-treated with silicates as disclosed in U.S. Pat. No. 2,714,066.

It is particularly preferred that the aluminum substrate be covered with an underlying coating as disclosed in J. P. KOKAI No. Sho 59-101651 (=U.S. Pat. No. 4,578,342).

A light-sensitive layer of the foregoing composition can be formed by dissolving, in an appropriate solvent, the light-sensitive diazo resin, the polymer binder, the organic compound of the invention and optional various additives in predetermined amounts to give a coating solution of the composition, then applying the coating solution to a substrate and drying the coated layer. Examples of solvents used are methyl cellosolve, ethyl cellosolve, dimethoxyethane, diethylene glycol monomethyl ether, diethylene glycol-dimethyl ether, 1-methoxy-2-propanol, methyl cellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethylsulfoxide and water. These solvents may be used alone, but preferred are mixtures of high boiling point solvents such as methyl cellosolve, 1-methoxy-2-propanol and methyl lactate with low boiling point solvents such as methyl ethyl ketone.

The concentration of the coating solution (solid content thereof) desirably ranges from 1 to 50% by weight. In this case, the amount of the light-sensitive composition to be applied in general ranges from about 0.2 to 10 g/m² and preferably 0.5 to 3 g/m² (weighed after drying).

A mat layer comprising projections independently formed thereon is preferably applied on the light-sensitive layer. The mat layer is applied for the purpose of improving the adhesion under vacuum of a film carrying negative images to the PS plate during the contact exposure to light to thus reduce the evacuation time and to prevent destroy of fine half tone dot images during exposure due to insufficient adhesion therebetween.

The mat layer can be formed by any known method such as a method described in U.S. Pat. No. 5,028,512 comprising fusion-bonding powdery solid particles to the surface of PS plates and a method disclosed in U.S. Pat. No. 4,557,994 comprising spraying an aqueous solution containing a polymer and then drying, but preferably the mat layer per se is soluble in an alkali developer or can be removed by the alkali developer.

The light-sensitive composition applied to the surface of a substrate is imagewise exposed to light through an original transparency carrying line images, half tone dot images or the like and then developed with an aqueous alkali developer to give relief images negative to the original.

Light sources favorable for imagewise exposure are, for instance, carbon arc lamps, mercury lamps, xenon lamps, metal halide lamps, strobo lights, sources for UV rays and laser sources.

The PS plate prepared from the light-sensitive composition of the invention may be developed with any known developer. Preferably, the developer comprises at least one alkali agent and water as essential components. Examples of such alkali agents included in the developer as an essential component are inorganic alkali substances such as sodium silicate, potassium silicate, potassium hydroxide, sodium hydroxide, lithium hydroxide, sodium or ammonium tertiary or secondary phosphate, sodium metasilicate, sodium carbonate and ammonia; and organic amine compounds such as mono-, di- or trimethylamine, mono-, di- or triethylamine, mono- or diisopropylamine, n-butylamine, mono-, di- or triethanolamine, mono-, di- or tr iisopropanolamine, ethyleneimine and ethylenediimine. The concentration of these alkali agents in the developer ranges from 0.05 to 10% by weight and preferably 0.5 to 5% by weight. This is because if it is less than 0.05% by weight, the PS plate is insufficiently developed, while if it exceeds 10% by weight, printing properties of the resulting lithographic printing plate are adversely influenced.

These developers may optionally comprise specific organic solvents. Preferred organic solvents are those capable of dissolving or swelling unexposed areas (non-image areas) of the light-sensitive layer and having a solubility in water of not more than 10% by weight at ordinary temperature (20° C.). Specific examples thereof are carboxylic acid esters such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexanone; alcohols such as ethylene glycol monobutyl ether, ethylene glycol benzyl ether, ethylene glycol monophenyl ether, benzyl alcohol, methylphenylcarbinol, n-amyl alcohol and methylamyl alcohol; alkyl-substituted aromatic hydrocarbons such as xylene; and halogenated hydrocarbons such as methylene dichloride, ethylene dichloride and monochlorobenzene. These solvents may be used alone or in combination. Among these solvents, particularly useful are ethylene glycol monophenyl ether and benzyl alcohol. The content of these organic solvents in the developer generally ranges from 0 to 20% by weight and more preferred results can be obtained when they are used in an amount ranging from 2 to 10% by weight.

The developer used in the invention may, if necessary, comprise a water-soluble sulfite. Examples of such water-soluble sulfites are preferably alkali or alkaline earth metal salts of sulfurous acid such as sodium sulfite, potassium sulfite, lithium sulfite and magnesium sulfite. The amount of these sulfites in the developer composition ranges from 0 to 4% by weight and preferably 0.1 to 1% by weight.

A hydroxyl group-containing aromatic compound such as an alkali-soluble pyrazolone compound, an alkali-soluble thiol compound or methyl resorcin may be used instead of the foregoing water-soluble sulfite. The compound may of course be used in combination with the water-soluble sulfite.

The developer may optionally comprise other additives such as antifoaming agents and water softeners. Examples of water softeners are polyphosphates and aminopolycarboxylic acids. The optimum amount of the water softener varies depending on the hardness and the amount of hard water used, but in general ranges from 0.01 to 5% by weight and preferably 0.01 to 0.5% by weight on the basis of the developer practically employed.

The developer may comprise an agent for sufficiently solubilizing the organic solvent in water. The solubilizing agent is preferably a low molecular weight alcohol or ketone having a solubility in water higher than that of the organic solvent used in order to ensure the desired effect of the present invention. The developer may also comprise an anionic surfactant and/or an amphoteric surfactant.

Examples of preferred alcohols and ketones include methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol and N-methylpyrrolidone. Examples of preferred surfactants include sodium isopropylnaphthalenesulfonate, sodium n-butylnaphthalenesulfonate, sodium N-methyl-N-pentadecylaminoacetate and sodium laurylsulfate. In general, the amount of the solubilizing agents such as alcohols and ketones is preferably not more than about 30% by weight on the basis of the total weight of the developer.

However, the developers containing organic solvents suffer from various problems of, for instance, hygiene (such as toxicity and giving out of bad smells during working), safety (such as firing and gas explosion), workability (such as foaming), environmental pollution due to waste fluids and cost. Therefore, the developers substantially free of organic solvents are more preferably used.

In this respect, the developer "substantially free of organic solvents" means a developer which does not contain any organic solvent to such an extent that the foregoing problems of hygiene, safety, workability or the like arise and more specifically, a developer comprising organic solvents in an amount of not more than 2% by weight and preferably not more than 1% by weight.

The aqueous alkaline developers substantially free of organic solvents usable in the invention are developer compositions used for developing positive-working PS plates after imagewise exposure to light such as those disclosed in, for instance, U.S. Pat. Nos. 4,500,625 and 4,467,027 and J. P. KOKAI No. Sho 62-22263.

The PS plates prepared from the light-sensitive composition of the invention may of course be treated by the plate-making methods disclosed in J. P. KOKAI No. Sho 54-8002, U.S. Pat. No. 4,291,117 and J. P KOKAI No. Sho 59-58431. More specifically, after development of the PS plates, they may be desensitized after water-washing; desensitized without water-washing; treated with an aqueous solution containing an acid; or desensitized after treating with an aqueous solution containing an acid. Moreover, the alkali concentration is reduced in the developing process of this type due to the consumption of the aqueous alkali solution in proportion to the amount of PS plates processed or due to absorption of air (carbon dioxide) when an automatic developing machine is operated over a long time. This results in the reduction of the processing ability of the developer. However, the processing ability thereof can be recovered through supplementation of a replenisher as disclosed in U.S. Pat. No. 4,259,434. In this case, the supplementation of the replenisher is preferably carried out by the method described in U.S. Pat. No. 4,882,246.

The foregoing plate-making process is preferably performed using an automatic developing machine as disclosed in U.S. Pat. No. 2,952,958 and J. P. KOKAI Hei 2-32357. A desensitizing gum optionally applied to the plate in the final stage of the plate-making process is preferably those described in U.S. Pat. Nos. 4,348,954, and 4,268,613 and J. P. KOKOKU No. Sho 63-52600 and U.S. Pat. Nos. 4,731,119, and 4,719,172 and J .P. KOKAI No. Sho 62-83194.

The light-sensitive composition of the present invention can easily be developed with an aqueous alkaline developer, can provide a lithographic printing plate having good printing durability and has excellent storage stability. Therefore, the developability and resistance to contamination thereof are not deteriorated even after storing it under high temperature and humidity conditions over a long time.

The light-sensitive composition of the invention will hereinafter be explained in more detail with reference to the following non-limitative working Examples and the effects of the composition practically attained will also be discussed in comparison with Comparative Examples.

EXAMPLE 1

An aluminum alloy plate having a thickness of 0.24 mm prepared by rolling a JIS A1050 aluminum material comprising 99.5% Al, 0.01% Cu, 0.03% Ti, 0.3% Fe and 0.1% Si was surface-grained using a rotary nylon (6–10 nylon) brush and a 20% by weight suspension of 400 mesh pumice stone (available from Kyoritsu Ceramic Materials Co., Ltd.) and then sufficiently washed with water.

The surface-grained plate was etched by immersing in a 15% by weight aqueous solution of sodium hydroxide (containing 5% by weight of Al ion) to an extent that the amount of the dissolved aluminum reached 5 g/m$^2$ and washed with running water. After neutralizing the plate with a 1% by weight nitric acid solution, it was electrolytically surface-roughened in a 0.7% by weight aqueous nitric acid solution (containing 0.5% Al in the form of ions) using a rectangular alternating waved current (current ratio: r=0.90 V; the current wave form is disclosed in Examples of J. P. KOKOKU No. Sho 58-5796) having 9.3 V of anodic voltage and 10.5 V of cathodic voltage such that the quantity of electricity at the anode time was 160 coulomb/dm$^2$. After water-washing, the plate was etched by immersing in a 10% by weight aqueous sodium hydroxide solution to an extent that the amount of the dissolved aluminum reached 1 g/m$^2$ and then washed with water. Then the plate was desmutted by immersing in a 30% aqueous sulfuric acid solution maintained at 50° C. and washed with water.

A porous anodization layer was formed on the plate by passing a direct current through the plate in a 20% by weight aqueous sulfuric acid solution (containing 0.8% Al in the form of ions) at 35° C. More specifically, the plate was electrolyzed at a current density of 13 A/dm$^2$ while controlling the electrolysis time in such a manner that the weight of the anodized film was 2.0 g/m$^2$. After water washing, the plate was immersed in a 3% aqueous solution of sodium silicate at 70° C. for 30 minutes and them washed with water.

The aluminum substrate thus obtained had a reflection density of 0.28 as determined by a Macbeth RD920 reflection densitometer and a central line-averaged surface roughness of 0.5μ.

An underlying coating solution-1 having the following formulation was applied to the aluminum plate and dried at 80° C. for 30 seconds. The dry weight of the underlying coating layer was 20 mg/m$^2$.

| Underlying Coating Solution-1 | |
|---|---|
| Component | Amount (g) |
| methyl methacrylate/ethyl acrylate/sodium 2-acrylamido-2-methylpropanesulfonate copolymer (molar ratio = 60/25/15) | 0.2 |
| methanol | 100 |

Then there was prepared a polyurethane resin (a) to which carboxyl groups were introduced by the following method. To a 500 ml volume 3-necked, round bottom flask equipped with a condenser and a stirring machine, there were added 11.5 g (0.0860 mole) of 2,2-bis(-hydroxymethyl)propionic acid, 7.26 g (0.0684 mole) of diethylene glycol and 4.11 g (0.0456 mole) of 1,4-butanediol and these compounds were dissolved in 118 g of N,N-dimethylacetamide. To the resulting solution, there were added 30.8 g (0.123 mole) of 4,4'-diphenylmethanediisocyanate, 13.8 g (0.0819 mole) of hexamethylenediisocyanate and 0.1 g of di-n-butyl tin dilaurate as a catalyst and the mixture was stirred at 90° C. for 7 hours with stirring. To the reaction solution, there were added 100 ml of N,N-dimethylacetamide, 50 ml of methanol and 50 ml of acetic acid, then the mixture was stirred and poured into 4 l of water with stirring to precipitate white polymer particles. The polymer was removed by filtration, washed with water and then dried under reduced pressure to give 62 g of the polymer (polyurethane resin (a)).

The weight-average molecular weight of the polymer was determined by the gel permeation chromatography (GPC) and found to be 70,000 (polystyrene standard). In addition, the carboxyl value was determined by titration and found to be 1.12 meq/g.

Then a light-sensitive solution 1 having the following formulation was applied to the aluminum substrate prepared above with a bar coater and dried at 120° C. for 30 seconds. The dry weight of the light-sensitive layer thus applied was 1.5 g/m².

| Light-Sensitive Solution 1 | |
|---|---|
| Component | Amount (g) |
| polyurethane resin (a) | 5 |
| di-t-butylnaphthalenesulfonate of condensate of 4-diazodiphenylamine with formaldehyde | 0.5 |
| propane-1,2,3-tricarboxylic acid (organic compound of the invention) | 0.1 |
| tricresyl phosphate | 0.3 |
| pivalic acid ester of p-hydroxystyrene (degree of esterification = 50%) | 0.1 |
| fluorine atom-containing surfactant: Megafac F-177 (available from Dainippon Ink and Chemicals, Inc.) | 0.06 |
| Victoria Pure Blue BOH | 0.18 |
| 1-methoxy-2-propanol | 30 |
| methanol | 30 |
| methyl ethyl ketone | 40 |
| water | 1 |

After the application of the light-sensitive layer, the surface thereof was matted by coating it with a solution having the following composition through electrostatic spraying and subsequently drying it by exposure to an atmosphere of 80° C. for 5 seconds.

| Spraying Solution | |
|---|---|
| Component | Amount (g) |
| methyl methacrylate/ethyl acrylate/sodium 2-acrylamido-2-methylpropanesulfonate (molar ratio = 60/25/15) copolymer | 0.5 |
| Tartrazine | 0.01 |
| water | 100 |

The height of each mat was 2 to 6μ, the width thereof was 20 to 150μ, the density thereof was about 100/m² on the average and the coated amount thereof was 0.1 g/m².

The PS plate thus prepared was hereinafter referred to as PS plate 1A.

By way of comparison, the same procedures used above were repeated except that propane-1,2,3-tricarboxylic acid was not used and that citric acid was substituted for the propane-1,2,3-tricarboxylic acid to give PS plates 1B and 1C respectively.

These PS plates 1A, 1B and 1C each was stored under high temperature and humidity conditions (45° C., 75% RH) for a predetermined time and then imagewise exposed to light for one minute at a distance of 1 m using PS Light (available from Fuji Photo Film Co., Ltd.).

Then these imagewise exposed PS plates were developed under the following conditions. A developer-1 having the following composition and a finisher FN-2 (available from Fuji Photo Film Co., Ltd.) were charged into an automatic developing machine STABLON 900N (available from Fuji Photo Film Co., Ltd.) and each PS Plate was developed at a developer temperature of 25° C. for 20 seconds.

| Developer-1 | |
|---|---|
| Component | Amount (g) |
| benzyl alcohol | 30 |
| triethanolamine | 10 |
| sodium sulfite | 5 |
| sodium isopropylnaphthalenesulfonate | 10 |
| water | 1000 |

The resulting lithographic printing plates 1A, 1B and 1C each was fitted to a printing press SOR (available from Heidelberg Company) and printing operation was carried out to determine the resistance to background contamination and printing durability thereof. The results obtained are listed in the following Table 1. In Table 1, the resistance to background contamination is expressed in terms of the storage time (days; storage conditions: 45° C., 75%RH) at which background contamination is observed for each corresponding lithographic printing plate and, therefore, the longer the storage time, the higher the storage stability.

TABLE 1

| Lithographic Printing Plate | Background Contamination (storage time) | Printing Durability (No. of copies) |
|---|---|---|
| 1A | 10 days | 100,000 |
| 1B | 3 days | 100,000 |
| 1C | 5 days | 100,000 |

The data listed in Table 1 clearly indicate that the light-sensitive composition is alkali-developable and has high printing durability and substantially improved storage stability.

EXAMPLES 2 TO 6

Polyurethane resins (b) to (f) were prepared in the same manner used in Example 1 using diisocyanates and diol compounds listed in the following Table 2. The weight-average molecular weigths and acid values of these polyurethane resins were determined by GPC and titration respectively. The results are also listed in Table 2.

A light-sensitive solution having the following formulation was applied onto an aluminum plate provided with an underlying coating prepared in the same manner used in Example 1 with a bar coater so that the dry weight thereof reached 1.5 g/m² and then dried at 120° C. for 30 seconds.

| Light-Sensitive Solution | |
|---|---|
| Component | Amount (g) |
| polyurethane resin (b)~(f) (shown in Table 2) | 5 |
| high molecular weight diazo compound described in Preparation Example 1 of J.P. KOKAI No. Sho 63-262643 | 1.2 |
| propane-1,2,3-tricarboxylic acid (organic compound of the invention) | 0.1 |
| tricresyl phosphate | 0.25 |
| styrene/maleic anhydride copolymer half-esterified with 4-methyl-2-pentanol | 0.1 |
| fluorine atom-containing compound represented by the formula: $(C_8F_{17}CH_2CH_2O)_2PO(OH)$ | 0.03 |
| N-butylperfluorooctanesulfonamidoethyl acrylate/polyoxypropylene acrylate (weight ratio = 40/60) copolymer (molecular weight (MW) = 15,000) | 0.06 |
| compound represented by the formula: $nC_4H_9-NH-CO-NH-CH_2CH_2CH_2OC_2H_5$ | 0.5 |
| naphthalenesulfonate of Victoria Pure Blue BOH | 0.15 |
| 1-methoxy-2-propanol | 20 |
| methanol | 40 |
| methyl ethyl ketone | 40 |
| water | 1 |

After the application of the light-sensitive layer, the surface thereof was mat-treated in the same manner used in Example 1.

The PS plates thus prepared were allowed to stand under high temperature and humidity conditions of 45° C. and 75%RH for 10 days, followed by development and printing operation in the same manner used in Example 1. As a result, it was found that all of these PS plates could provide lithographic printing plates which were free of background contamination and provided clear copies of not less than 100,000.

TABLE 2

| Example No. | Polyurethane Resin | Diisocyanate Compound Used | Diol Compound Used (mole %) | Weight-Average Molecular Weight (Polyethylene Standard) | Acid Value [meq/g] |
|---|---|---|---|---|---|
| 2 | b | OCN-C₆H₄-CH₂-C₆H₄-NCO (70) / OCN(CH₂)₆NCO (30) | 3,5-dihydroxybenzoic acid (HO-C₆H₃(OH)-COOH) (60) / HO(CH₂CH₂O)₂H (40) | 84,000 | 1.70 |
| 3 | c | 1-methyl-1-isocyanato-3,3-dimethyl-5-isocyanatomethylcyclohexane (isophorone diisocyanate) (50) / OCNH₂C-C₆H₄-CH₂NCO (50) | bis(4-hydroxyphenyl)acetic acid (HO-C₆H₄-CH(COOH)-C₆H₄-OH) (50) / HO(CH₂CH₂O)₄H (50) | 60,000 | 1.20 |
| 4 | d | OCN-C₆H₄-CH₂-C₆H₄-NCO (80) / OCN(CH₂)₆NCO (20) | CH₃-C(CH₂OH)₂-COOH (dimethylolpropionic acid) (65) / HO(CH₂CH₂O)₄H (35) | 120,000 | 1.68 |
| 5 | e | 1,5-naphthalene diisocyanate (30) / OCN(CH₂)₆NCO (70) | HOCH₂-C(CH₃)(COOC₄H₉NHCONHSO₂C₆H₅)-CH₂OH (80) / HO(CH₂CH₂O)₄H (20) | 32,000 | 1.60 |
| 6 | f | 2,4-tolylene diisocyanate (OCN-C₆H₃(CH₃)-NCO) (100) | HOCH₂-C(CH₃)(CH₂OCONHSO₂-C₆H₄-CH₃)-CH₂OH (80) / HO(CH₂CH₂O)₂H (20) | 30,000 | 1.81 |

EXAMPLE 7

A light-sensitive solution having the following formulation was applied onto an aluminum plate prepared in the same manner used in Example 1 using a whirler so that the dry weight thereof was 2.0 g/m² and then dried at 80° C. for 2 minutes.

| Light-Sensitive Solution | |
|---|---|
| Component | Amount (g) |
| 2-hydroxyethyl methacrylate/methyl methacrylate/acrylonitrile/methacrylic acid (molar ratio = 35/25/35/5) copolymer (MW = 70,000) | 5 |
| hexafluorophosphate of condensate of 4-diazodiphenylamine with formaldehyde | 0.5 |
| butane-1,2,3,4-tetracarboxylic acid (organic compound of the invention) | 0.1 |
| tricresyl phosphate | 0.5 |
| styrene/maleic anhydride copolymer half-esterified with n-hexanol | 0.1 |
| t-butylnaphthalenesulfonic acid | 0.05 |
| fluorine atom-containing surfactant: Megafac F-177 (available from Dainippon Ink and Chemicals, Inc.) | 0.03 |
| Victoria Pure Blue BOH | 0.12 |
| methyl lactate | 10 |
| 1-methoxy-2-propanol | 30 |
| methanol | 30 |
| methyl ethyl ketone | 30 |
| water | 1 |

The PS plate thus prepared was hereinafter referred to as "PS plate 7A". By way of comparison, the same procedures used above were repeated except that butane-1,2,3,4-tetracarboxylic acid was not used and that a polyacrylic acid (MW=20,000) was substituted for the butane-1,2,3,4-tetracarboxylic acid to give PS plates 7B and 7C respectively.

These PS plates 7A, 7B and 7C were allowed to stand under high temperature and humidity conditions of 45° C. and 75%RH for a predetermined time and then subjected to tests for determining the resistance to background contamination and printing durability in the same manner used in Example 1. The results thus obtained are summarized in the following Table 3.

TABLE 3

| Lithographic Printing Plate | Background Contamination (storage time) | Printing Durability (No. of copies) |
|---|---|---|
| 7A | 5 days | 50,000 |
| 7B | 3 days | 50,000 |
| 7C | 4 days | 30,000 |

The data listed in Table 3 clearly indicate that the light-sensitive composition of the present invention simultaneously satisfies the requirements of high alkali-developability and printing durability and has improved storage stability, but when a polyacrylic acid having a high molecular weight is used, printing durability is deteriorated.

EXAMPLES 8 TO 11

The same procedures used in Example 7 were repeated except that compounds listed in the following Table 4 were substituted for the butane-1,2,3,4-tetracarboxylic acid used therein to give PS plates and the resulting PS plates were examined in the same manner used in Example 7. The results obtained are listed in Table 4.

TABLE 4

| Ex. No. | Organic Compound of the Invention | Contamination (storage time) days | Printing Durability (No. of Copies) |
|---|---|---|---|
| 8 | butane-1,2,4-tricarboxylic acid | 5 | 50,000 |
| 9 | 1,2,3,4-cyclopentane-tetracarboxylic acid | 5 | 50,000 |
| 10 | trimellitic acid | 4 | 50,000 |
| 11 | naphthalene-1,4,5,8-tetracarboxylic acid | 4 | 50,000 |

As seen from these data, the light-sensitive composition of the present invention simultaneously satisfies the requirements of alkali-developability and printing durability at high levels and has improved storage stability.

EXAMPLE 12

An aluminum alloy plate having a thickness of 0.24 mm prepared by rolling a JIS A1050 aluminum material comprising 99.5% Al, 0.01% Cu, 0.03% Ti, 0.3% Fe and 0.1% Si was surface-grained using a rotary nylon (6-10 nylon) brush and a 20% by weight suspension of 400 mesh pumice stone (available from Kyoritsu Ceramic Materials Co., Ltd.) and then sufficiently washed with water.

The surface-grained plate was etched by immersing in a 15% by weight aqueous solution of sodium hydroxide (containing 5% by weight of Al ion) to an extent that the amount of the dissolved aluminum reached 5 g/m² and washed with running water. After neutralizing the plate with a 1% by weight nitric acid solution, it was electrolytically surface-roughened in a 0.7% by weight aqueous nitric acid solution (containing 0.5% Al in the form of ions) using a rectangular alternating waved current (current ratio: r=0.90 V; the current wave form is disclosed in Examples of J. P. KOKOKU No. Sho 58-5796) having 9.3 V of anodic voltage and 10.5 V of cathodic voltage such that the quantity of electricity at the anode time was 160 coulomb/dm². After water-washing, the plate was etched by immersing in a 10% by weight aqueous sodium hydroxide solution to an extent that the amount of the dissolved aluminum reached 1 g/m² and then washed with water. Then the plate was desmutted by immersing in a 30% aqueous sulfuric acid solution maintained at 50° C. and washed with water.

A porous anodization layer was formed on the plate by passing a direct current through the plate in a 20% by weight aqueous sulfuric acid solution (containing 0.8% Al in the form of ions) at 35° C. More specifically, the plate was electrolyzed at a current density of 13 A/dm² while controlling the electrolysis time in such a manner that the weight of the anodized film was 2.0 g/m². After water washing, the plate was immersed in a 3% aqueous solution of sodium silicate at 70° C. for 30 minutes and then washed with water.

The aluminum substrate thus obtained had a reflection density of 0.28 as determined by a Macbeth RD920 reflection densitometer and a central line-averaged surface roughness of 0.5μ.

An underlying coating solution having the following formulation was applied to the aluminum plate and dried at 80° C. for 30 seconds. The dry weight of the underlying coating layer was 2 mg/m².

| Underlying Coating Solution | |
| --- | --- |
| Component | Amount (g) |
| methyl methacrylate/ethyl acrylate/sodium 2-acrylamido-2-methylpropanesulfonate copolymer (molar ratio = 60/25/15) | 0.02 |
| methanol | 100 |

Then a light-sensitive solution having the following formulation was applied to the aluminum substrate prepared above with a bar coater and dried at 120° C. for 30 seconds. The dry weight of the light-sensitive layer thus applied was 1.2 g/m².

| Light-Sensitive Solution | |
| --- | --- |
| Component | Amount (g) |
| polyurethane resin (d) (Shown in Table 2) | 5 |
| high molecular weight diazo compound described in Preparation Example 1 of J.P. KOKAI No. Sho 63-262643 | 1 |
| phosphoric acid (phosphorus atom-containing compound) | 0.05 |
| 4-sulfophthalic acid (sulfonate compound of the invention) | 0.05 |
| propane-1,2,3-tricarboxylic acid | 0.05 |
| tricresyl phosphate | 0.25 |
| styrene/maleic anhydride copolymer half-esterified with 4-methyl-2-pentanol | 0.1 |
| fluorine atom-containing compound represented by the formula: $(C_8F_{17}CH_2CH_2O)_{1.7}PO(OH)_{1.3}$ | 0.03 |
| N-butylperfluorooctanesulfonamidoethyl acrylate/polyoxypropylene acrylate (weight ratio = 40/60) copolymer (MW = 15,000) | 0.05 |
| compound represented by the formula: $HOCH_2CH_2OCONH(CH_2)_6NHCOOCH_2CH_2OH$ | 0.5 |
| 1-methoxy-2-propanol | 20 |
| methanol | 40 |
| methyl ethyl ketone | 40 |
| water | 1 |

After the application of the light-sensitive layer, the surface thereof was matted by coating it with a solution having the following composition through electrostatic spraying and subsequently drying it by exposure to an atmosphere of 80° C. for 5 seconds.

| Spraying Solution | |
| --- | --- |
| Component | Amount (g) |
| methyl methacrylate/ethyl acrylate/sodium 2-acrylamido-2-methylpropanesulfonate (molar ratio = 60/25/15) copolymer | 0.5 |
| Tartrazine | 0.01 |
| water | 100 |

The height of each mat was 2 to 6µ, the width thereof was 20 to 150µ, the density thereof was about 100/m² on the average and the coated amount thereof was 0.1 g/m².

The PS plate thus prepared was hereinafter referred to as PS plate 12A.

The same procedures used above were repeated except that polyurethane resin (a) was substituted for polyurethane resin (d) and an underlying coating layer was not provided to give PS plate 13A.

By way of comparison, the same procedures used above were repeated except that phosphoric acid, 4-sulfophthalic acid and propane-1,2,3-tricarboxylic acid were not used in the light-sensitive solution to give a PS plate 12B.

These PS plates 12A and 12B each was stored in an oven maintained at 60° C. for a predetermined time and then imagewise exposed to light for one minute at a distance of 1 m using PS Light (available from Fuji Photo Film Co., Ltd.).

Then these imagewise exposed PS plates were developed under the following conditions. A developer having the following composition and a finisher FN-2 (available from Fuji Photo Film Co., Ltd.) were charged into an automatic developing machine STABLON 900N (available from Fuji Photo Film Co., Ltd.) and each PS plate was developed at a developer temperature of 25° C. for 20 seconds.

| Developer | |
| --- | --- |
| Component | Amount (g) |
| benzyl alcohol | 30 |
| triethanolamine | 10 |
| sodium sulfite | 5 |
| sodium isopropylnaphthalenesulfonate | 10 |
| water | 1000 |

The resulting lithographic printing plates 12A and 12B each was fitted to a printing press SOR (available from Heidelberg Company) and printing operation was carried out to determine the resistance to background contamination and printing durability thereof. The results obtained are listed in the following Table 5. In Table 5, the resistance to background contamination is expressed in terms of the storage time (days; stored in an oven maintained at 60° C.) at which background contamination is observed for each corresponding lithographic printing plate and, therefore, the longer the storage time, the higher the storage stability.

TABLE 5

| Lithographic Printing Plate | Background Contamination (storage time) | Printing Durability (No. of copies) |
| --- | --- | --- |
| 12A | 5 days or longer | 80,000 |
| 12B | 1 day | 70,000 |
| 13A | 5 days or longer | 70,000 |

The data listed in Table 5 clearly indicate that the light-sensitive composition simultaneously satisfies both alkali-developability and printing durability at high levels and has substantially improved storage stability.

I claim:

1. A light-sensitive composition comprising, in admixture, about 3 to 40% by weight a diazo resin and about 60 to 97% by weight of a polymeric binder, the weight percentages being based on the total amount of diazo resin and polymer binder, and further comprising about 0.1 to 5% by weight based on the total solid content of the composition of a low molecular weight organic compound having at least 3 carboxyl groups and free of other functional groups containing elements other than hydrogen and carbon atoms.

2. The light-sensitive composition of claim 1 wherein the low molecular weight organic compound is an organic compound which comprises a skeleton, comprising only hydrogen and carbon atoms selected from alkyl and/or aryl groups, which is substituted with at least 3 carboxyl groups and which has a molecular weight of not more than 1,000.

3. The light-sensitive composition of claim 2 wherein the molecular weight of the low molecular weight organic compound is not more than 500.

4. The light-sensitive composition of claim 2 wherein the low molecular weight organic compound is a compound comprising an alkyl group having not more than 5 carbon atoms to which at least 3 carboxyl groups are bonded.

5. The light-sensitive composition of claim 4 wherein the low molecular weight organic compound is propane-1,2,3-tricarboxylic acid.

6. The light-sensitive composition of claim 1 wherein the composition further comprises a compound carrying at least one phosphorus atom-containing oxoacid residue and a compound carrying at least one sulfonic acid residue.

7. The light-sensitive composition of claim 6 wherein the compound carrying at least one phosphorus atom-containing oxoacid residue is a compound having at least one P—OH group which comprises phosphorous acid, hypophosphorous acid, phosphoric acid, phosphonic acid or phosphinic acid, as principal skeleton, whose hydrogen atom directly bonded to the phosphorus atom of the skeleton is substituted with a substituted or unsubstituted hydrocarbon, or an ester thereof or heterocyclic group, or an ester thereof.

8. The light-sensitive composition of claim 7 wherein the compound carrying at least one phosphorus atom-containing oxoacid residue is phosphorous acid or phosphoric acid.

9. The light-sensitive composition of claim 6 wherein the compound having at least one sulfonic acid residue is a compound comprising a hydrocarbon or heterocyclic group to which at least one sulfonic acid residue is attached and which is free of phosphorus atom-containing oxoacid residue.

10. The light-sensitive composition of claim 9 wherein the compound having at least one sulfonic acid residue is a compound having an aromatic ring to which at least 2 carboxyl groups and one sulfonic acid residue are bonded; a compound whose aromatic ring has hydroxyl group, carboxyl group and sulfonic acid residue; 2-hydroxy-4-methoxy-5-benzoylbenzenesulfonic acid or dibutylnaphthalenesulfonic acid.

11. The light-sensitive composition of claim 6 wherein the amounts of the compound carrying at least one phosphorus atom-containing oxoacid residue and the compound carrying at least one sulfonic acid residue range from 0.01 to 10% by weight on the basis of the total solid content of the composition, respectively.

12. The light-sensitive composition of claim 11 wherein the amounts of the compound carrying at least one phosphorus atom-containing oxoacid residue and the compound carrying at least one sulfonic acid residue range from 0.1 to 5% by weight on the basis of the total solid content of the composition, respectively.

13. The light-sensitive composition of claim 11 wherein the amount of the sum of the compound carrying at least one phosphorus atom-containing oxoacid residue and the compound carrying at least one sulfonic acid residue is not more than 15% by weight.

14. The light-sensitive composition of claim 1 wherein the polymer binder is a polyurethane resin having substituents carrying acidic hydrogen atoms whose acid dissociation constants in water are not higher than 7.

15. The light-sensitive composition of claim 1 wherein the amounts of the light-sensitive diazo resin and the polymer binder range from 5 to 30% by weight for the former and 95 to 70% by weight for the latter on the basis of the total amount of these components.

16. A light-sensitive composition according to claim 1, wherein the diazo resin is at least one member of the group consisting of organic solvent-soluble reaction products of condensates of p-diazodiphenylamine and formaldehyde with hexafluorophosphoric acid salts and organic solvent-soluble reaction products of the condensates with long chain alkyl group-containing sulfonic acids.

17. A light-sensitive composition according to claim 14, wherein the substituents are selected from the group consisting of —COOH, —SO$_2$NH—, COO—, —CONHSO$_2$NH—, and HNCONH—SO$_2$—.

18. A presensitized plate comprising an aluminum substrate having coated thereon a light-sensitive composition according to claim 1.

* * * * *